US010777295B2

(12) United States Patent
Frolikov

(10) Patent No.: US 10,777,295 B2
(45) Date of Patent: Sep. 15, 2020

(54) DEFECTIVE MEMORY UNIT SCREENING IN A MEMORY SYSTEM

(71) Applicant: Micron Technology, Inc., Boise, ID (US)

(72) Inventor: Alex Frolikov, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 15/952,166

(22) Filed: Apr. 12, 2018

(65) Prior Publication Data

US 2019/0318798 A1    Oct. 17, 2019

(51) Int. Cl.
| G06F 11/00 | (2006.01) |
| G11C 29/44 | (2006.01) |
| G11C 29/38 | (2006.01) |
| G06F 3/06 | (2006.01) |
| G06F 11/07 | (2006.01) |

(52) U.S. Cl.
CPC ............ *G11C 29/44* (2013.01); *G06F 3/0619* (2013.01); *G06F 3/0634* (2013.01); *G06F 3/0679* (2013.01); *G06F 11/076* (2013.01); *G06F 11/0727* (2013.01); *G06F 11/0793* (2013.01); *G11C 29/38* (2013.01)

(58) Field of Classification Search
CPC ...... G11C 29/44; G06F 3/0619; G06F 3/0634
See application file for complete search history.

(56) References Cited

U.S. PATENT DOCUMENTS

| 7,675,776 | B2 * | 3/2010 | Allen | G11C 29/76 |
| | | | | 365/185.09 |
| 8,055,942 | B2 * | 11/2011 | Haines | G06F 11/1048 |
| | | | | 714/16 |
| 8,539,315 | B2 * | 9/2013 | Hashimoto | G11C 29/04 |
| | | | | 365/185.01 |
| 9,032,264 | B2 * | 5/2015 | Hashimoto | G11C 29/08 |
| | | | | 714/719 |
| 9,116,823 | B2 * | 8/2015 | Fillingim | G06F 11/1044 |
| 9,396,080 | B2 * | 7/2016 | Malshe | G11C 29/00 |
| 9,595,320 | B2 * | 3/2017 | Wu | G11C 16/26 |
| 10,249,371 | B2 * | 4/2019 | Maeda | G11C 16/0483 |
| 10,304,559 | B2 * | 5/2019 | Naik | G11C 16/3436 |
| 10,446,251 | B2 * | 10/2019 | Kantipudi | G11C 29/42 |
| 2012/0221884 | A1 * | 8/2012 | Carter | G06F 11/0772 |
| | | | | 714/2 |

OTHER PUBLICATIONS

ECC memory, Wikipedia, printed on Apr. 10, 2018.
(Continued)

*Primary Examiner* — Esaw T Abraham
(74) *Attorney, Agent, or Firm* — Greenberg Traurig

(57) ABSTRACT

A memory system having non-volatile media and a controller configured to process requests from a host system to store data in the non-volatile media or retrieve data from the non-volatile media. The non-volatile media has a set of memory units. The memory system stores an indicator indicating whether the memory system is operating in a user mode or a manufacturing mode. A defect manager of the memory system identifies a threshold based on the indicator, monitors an error rate in reading data from the non-volatile media and, in response to the error rate reaching the threshold, screens the non-volatile media for defective memory units.

20 Claims, 3 Drawing Sheets

(56) References Cited

OTHER PUBLICATIONS

Enabling Software BCH Error Correction Code (ECC) on a Linux Platform, Micron Technical Note TN-29-71, Apr. 2012.
Error Correction Code (ECC) in Micron Single-Level Cell (SLC) NAND, Micron Technical Note TN-29-63, May 2011.
Error detection and correction, Wikipedia, printed on Apr. 10, 2018.
Forward error correction, Wikipedia, printed on Apr. 10, 2018.
Hamming code, Wikipedia, printed on Apr. 10, 2018.
Mark Hawes, "How Micron FortisFlash Technology Improves Performance and Endurance", Feb. 2015.
Raw NAND ECC, Texas Instruments Wiki, http://processors.wiki.ti.com/index.php/Raw_NAND_ECC, printed on Apr. 10, 2018.
Yu Cai, Yixin Luo, Saugata Ghose, Erich F. Haratsch, Ken Mai, Onur Mutlu, "Read Disturb Errors in MLC NAND Flash Memory: Characterization, Mitigation, and Recovery", SAFARI Technical Report No. 2015-006, Apr. 2015.

\* cited by examiner

DEFECTIVE MEMORY UNIT SCREENING IN A MEMORY SYSTEM

FIELD OF THE TECHNOLOGY

At least some embodiments disclosed herein relate to memory systems in general, and more particularly, but not limited to screening for defective memory units in memory systems.

BACKGROUND

A memory system can be a storage system, such as a solid-state drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

A memory system can store data with redundant information for error detection and/or error correction. Error detection can be implemented via techniques such as parity bits, checksums, cyclic redundancy checks (CRCs), cryptographic hashes, error-correcting codes, etc. Error detection techniques allow the detection of the presence of errors in data retrieved from the memory system. Error correction codes can be used to not only detect the presence of errors but also the recovery of the original data, or the most likely original data, when the extend of the errors is within a limit. In response to an error, the memory system may read the data again from the storage media to retrieve data that is error free and/or data that can be combined with an error correction code to reconstruct the original data.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
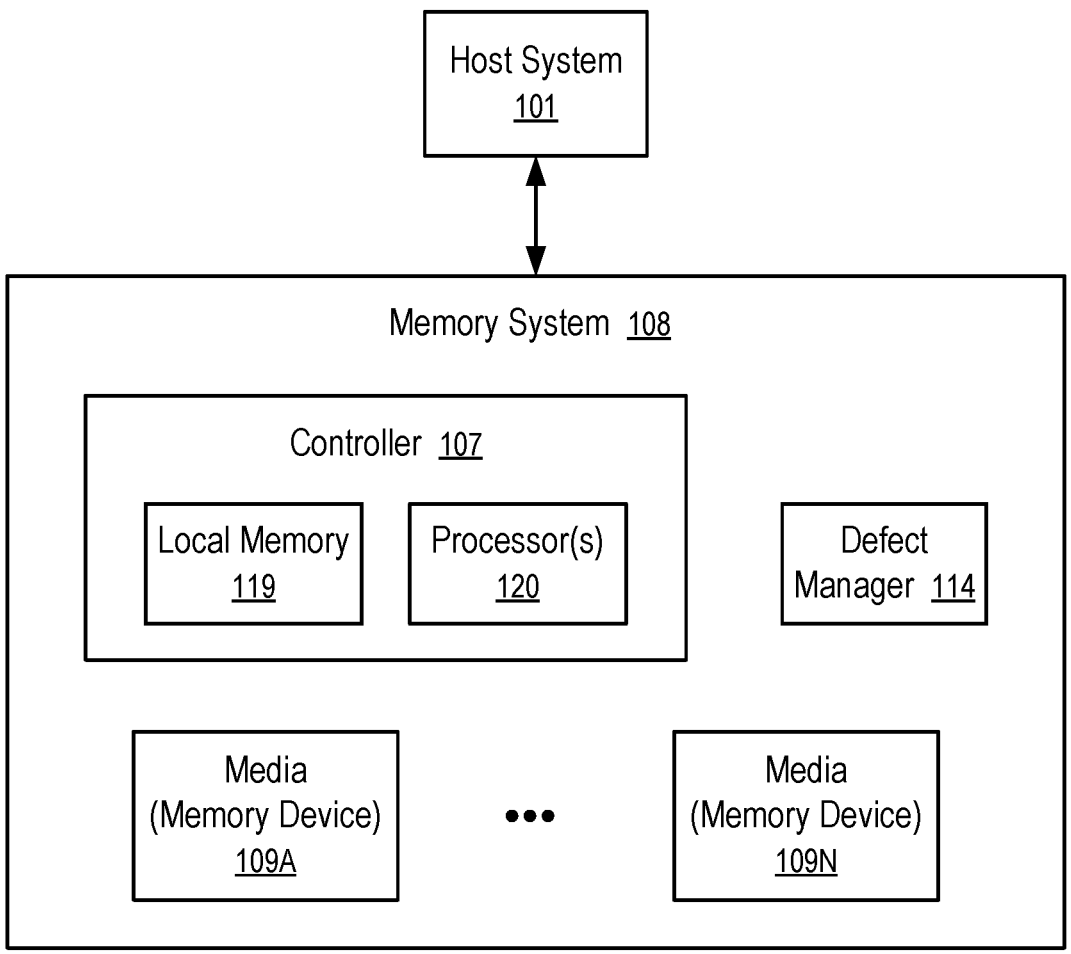
FIG. 1 shows a computing system having a memory system having a defect manager in accordance with some embodiments of the present disclosure.

At least some aspects of the present disclosure are directed to the screening of defective memory units in a memory system. An example of a memory system is a storage system, such as a solid-state drive (SSD). In some embodiments, the memory system is a hybrid memory/storage system. In general, a host system can utilize a memory system that includes one or more memory devices. The memory devices can include non-volatile memory devices, such as, for example, memory units formed based on negative-and (NAND) logic gates, memory units formed based on negative-or (NOR) logic gates, etc. The host system can provide write requests to store data at the memory devices of the memory system and can provide read requests to retrieve data stored at the memory system. A memory system can include a controller that manages the memory devices to perform operations such as reading data, writing data, or erasing data and other such operations. A storage system is used as one example of the memory system in the present disclosure.

For improved reliability, a solid-state drive (SSD) can store the data provided by the host system with redundant information that allows error detection and/or correction. For example, a data item can be stored in the SSD with an error correction code (ECC), cyclic redundancy check (CRC), checksum, and/or cryptographic hash of the data item.

During a read operation, the SSD uses the redundant information to determine whether the data item retrieved from the storage media of the SSD has an error. If there is an initial error in the read operation, the SSD can retry the read operation and/or reconstruct the original data item via an error correction method. Through retrying the read operation (e.g., less than a threshold number of times) and/or error correction, the SSD may overcome the initial error and recover the original data item. When the SSD successfully recovers the original data stored in a memory unit, the SSD may not identify the memory unit that produces one or more initial errors in retrieving the data item as being defective.

A defect manager can track a ratio of initial errors in read operations performed on memory units that are not yet identified as being defective. When the ratio is above a threshold, the defect manager can start an operation to screen/scan the storage media for defective memory units. After removing, from the capacity of the storage media of the SSD, the defective memory units identified via the screening operation, the SSD improves its reliability and/or performance by reducing initial errors in read operations and/or the likelihood of using a defective memory unit, or a failing memory unit, in storing data.

The SSD can be configured to operate under a manufacturing mode and a user mode. For example, the SSD can be assembled and tested in a manufacturing facility and then subsequently installed in a computer system of a user to perform its designed, normal service functions in the computer system. During the manufacturing process, the SSD can be temporarily connected to a computer system at the manufacturing facility for diagnosis, testing, and/or other processing and preparation. An indicator is stored in the SSD to indicate whether the SSD is in the manufacturing phase or in a production phase.

During the time of the diagnosis and/or testing, the indicator has a value indicating that the SSD is in the manufacturing phase. When operated with such a value in the SSD for the indicator, the SSD is in the manufacturing mode and is configured to perform not only the designed, normal service functions, but also additional functions that are specific to the manufacturing of the SSD, such as diagnosis and testing. When in the manufacturing mode, the defect manager uses a lower threshold for triggering the screening of defective memory units during the diagnosis and testing of the SSD.

To complete the manufacturing of the SSD, the indicator is changed to another value indicating that the SSD is in the production phase.

When the indicator has the value representing the production phase, the SSD operates in a user mode in which the SSD performs the designed, normal service functions in a computer system in which it is installed and does not performed the additional functions specific for the manufacturing process. When in the user mode, the defect manager uses a higher threshold for triggering the screening of defective memory units during the normal usage of the SSD.

Thus, the defect manager can automatically trigger a defect screening in the manufacturing mode according to a manufacturing mode threshold that is lower than a user mode threshold used to trigger a defect screening in the user mode.

FIG. 1 shows a computing system having a memory system (108) having a defect manager (114) in accordance with some embodiments of the present disclosure.

The memory system (108) of FIG. 1 has a defect manager (114) that tracks initial read errors that are overcome through retry read operations and/or the use of error correction techniques. The defect manager (114) uses the current operating mode of the memory system (108) to identify a threshold for initiating the screening for defective memory units when a ratio of read operations having initial errors is above the threshold. The threshold is lower when the memory system (108) operates in a manufacturing mode than in a user mode.

In general, the memory system (108) can include media, such as memory devices (109A to 109N). The memory devices (109A to 109N) can be volatile memory devices, non-volatile memory (NVM) devices, or a combination of such. In some embodiments, the memory system (108) is a storage system. An example of a storage system is a solid-state drive (SSD). In some embodiments, the memory system (108) is a hybrid memory/storage system. In general, the computing system can include a host system (101) that uses the memory system (108). In some implementations, the host system (101) can write data to the memory system (108) and read data from the memory system (108).

The host system (101) can be a computing device such as a desktop computer, laptop computer, network server, mobile device, or such computing device that includes a memory and a processing device. The host system (101) can include or be coupled to the memory system (108) so that the host system (101) can read data from or write data to the memory system (108). The host system (101) can be coupled to the memory system (108) via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Small Computer System Interface (SCSI), Serial Attached SCSI (SAS), etc. The physical host interface can be used to transmit data between the host system (101) and the memory system (108). The host system (101) can further utilize an NVM Express (NVMe) interface to access the memory devices (109A to 109N) when the memory system (108) is coupled with the host system (101) by the PCIe interface. The physical host interface can provide an interface for passing control, address, data, and other signals between the memory system (108) and the host system (101).

The memory devices (109A to 109N) can include any combination of the different types of non-volatile memory devices and/or volatile memory devices. An example of non-volatile memory devices includes a negative-and (NAND) type flash memory. Each of the memory devices (109A to 109N) can include one or more arrays of memory cells such as single level cells (SLCs), multi-level cells (MLCs), triple level cells (TLCs), quad-level cells (QLCs), etc. In some implementations, a particular memory device can include both an SLC portion and a MLC (or TLC or QLC) portion of memory cells. Each of the memory cells can store one or more bits of data used by the host system (101). Although non-volatile memory devices such as NAND type flash memory are described, the memory devices (109A to 109N) can be based on any other type of memory such as a volatile memory. In some implementations, the memory devices (109A to 109N) can be, but are not limited to, random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices (109A to 109N) can be grouped as memory pages or data blocks that can refer to a unit of the memory device used to store data.

The controller (107) can communicate with the memory devices (109A to 109N) to perform operations such as reading data, writing data, or erasing data at the memory devices (109A to 109N) and other such operations. The controller (107) can include hardware such as one or more integrated circuits and/or discrete components, a buffer memory, or a combination thereof. The controller (107) can be a microcontroller, special purpose logic circuitry (e.g., a field programmable gate array (FPGA), an application specific integrated circuit (ASIC), etc.), or another suitable processor. The controller (107) can include one or more processors (processing devices) (120) configured to execute instructions stored in local memory (119).

In the illustrated example, the local memory (119) of the controller (107) includes an embedded memory configured to store instructions for performing various processes, operations, logic flows, and routines that control operation of the memory system (108), including handling communications between the memory system (108) and the host system (101), and the functions of the defect manager (114), which is described in greater detail below. In some embodiments, the local memory (119) can include memory for the implementation of the defect manager (114) and/or memory registers storing, e.g., memory pointers, fetched data, etc. The local memory (119) can include read-only memory (ROM) for storing micro-code.

While the example memory system (108) in FIG. 1 has been illustrated as including the controller (107), in another embodiment of the present disclosure, a memory system (108) may not include a controller (107), and may instead rely upon external control (e.g., provided by an external host, or by a processor or controller separate from the memory system).

In general, the controller (107) can receive commands or operations from the host system (101) and can convert the commands or operations into instructions or appropriate commands to achieve the desired access to the memory devices (109A to 109N). The controller (107) can be responsible for other operations such as wear leveling operations, garbage collection operations, error detection and error-correcting code (ECC) operations, encryption operations, caching operations, and address translations between a logical block address and a physical block address that are associated with the memory devices (109A to 109N). The controller (107) can further include host interface circuitry to communicate with the host system (101) via the physical host interface. The host interface circuitry can convert the commands received from the host system into command instructions to access the memory devices (109A to 109N) as well as convert responses associated with the memory devices (109A to 109N) into information for the host system (101).

The memory system (108) can also include additional circuitry or components that are not illustrated. In some implementations, the memory system (108) can include a cache or buffer (e.g., DRAM) and address circuitry (e.g., a row decoder and a column decoder) that can receive an address from the controller (107) and decode the address to access the memory devices (109A to 109N).

In one example, the host system (101) has one or more connectors to provide the memory system (108) with power and/or communicate with the memory system (108) via a communication channel and a predetermined protocol; and the memory system (108) has one or more connectors to receive the power, data and commands from the host system (101). For example, the connection between connector on the host system (101) and connector on memory system (108) may utilize a PCIe bus or a SATA bus.

Figure 2:
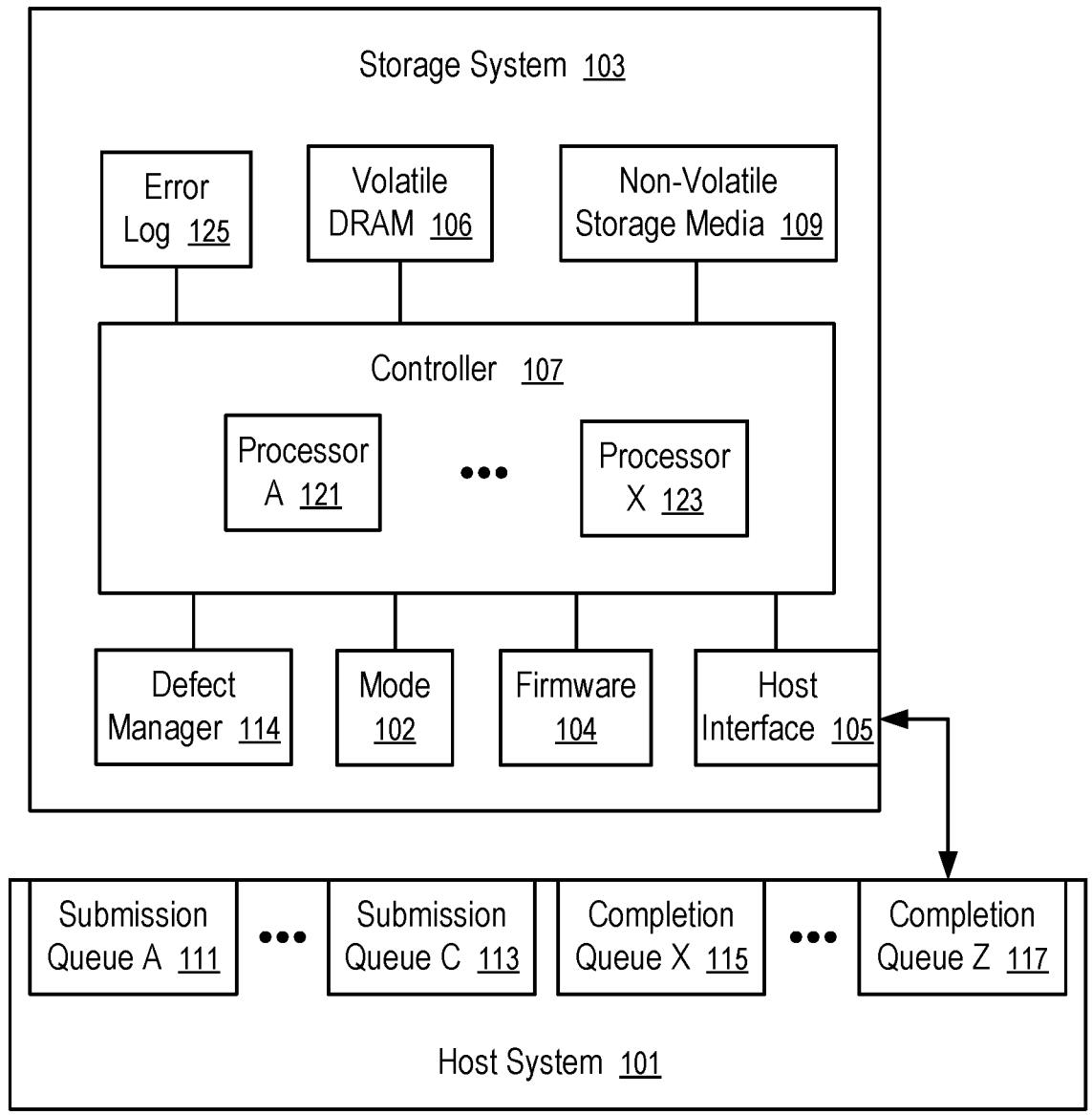
FIG. 2 shows a storage system that performs defect screening based on a mode of the storage system.

FIG. 2 shows a storage system (103) that performs defect screening based on an operating mode (102) of the storage system (103). For example, the storage system (103) of FIG. 2 can be used as an example of the memory system (108) in the computing system of FIG. 1.

The storage system (103) of FIG. 2 has a controller (107) executing firmware (104) to store data in or retrieve data from non-volatile storage media (109) using resources, such as volatile memory (106), registers, stacks, inter-process communication channels, in response to requests/commands communicated from the host system (101) via a host interface (105).

The controller (107) has a plurality of processors (121, ..., 123) that can be configured via the firmware (104) to run a plurality of processes that perform respectively a plurality of predefined types of tasks. Tasks of each type provide a core functionality of the storage system (103). Optionally, each process, running a processor (e.g., 121) to perform a type of tasks, is controlled by a respective task manager running in the processor (e.g., 121) in the controller (107).

For example, a flash translation layer manager can perform a type of tasks of translating a logical address to a physical address that is usable to address a memory unit in the non-volatile storage media (109).

For example, an input/output manager can perform a type of tasks of accessing the non-volatile storage media (109) to store data or retrieve data using a physical address.

For example, an administrative manager can perform a type of tasks of processing administrative commands, such as the creation or deletion of a namespace, the allocations of resources, etc.

When the input/output manager stores a data item in the non-volatile storage media (109), the input/output manager computes redundant information of the data item and stores the redundant information with the data item in the non-volatile storage media (109).

For example, the redundant information of the data item may include an error correction code (ECC), a cyclic redundancy check (CRC), a checksum, and/or a cryptographic hash of the data item.

When the input/output manager retrieves the data item from the non-volatile storage media (109), the input/output manager also retrieves the redundant information. The redundant information is used to determine whether the retrieved data item has an error. If an initial error is detected in retrieving the data item, the input/output manager can retry the read operation and/or recover the original data item using the redundant information.

The input/output manager records in an error log (125) the occurrences of the initial errors that are eventually overcome through retrying the read operation and/or using the redundant information. Based on the error log (125), the defect manager (114) computes a rate of initial errors in read operations.

For example, a rate of initial errors in read operations can be the ratio between the number of data items successfully retrieved from a region of the non-volatile storage media (109) but with initial errors that are overcome/corrected via retry or error correction techniques and the total number of data items successfully retrieved from the region of the non-volatile storage media (109) with or without initial errors.

For example, a rate of initial errors in read operations can be the ratio between the number of data items read from a region of the non-volatile storage media (109) with initial errors and the number of data items read from the region of the non-volatile storage media (109) without initial errors.

The rate can be computed for a predetermined time period, such as the past hour, the past day, the past week, or the past month.

The region of the non-volatile storage media (109) for which the rate is computed can be a page of memory units, a block of memory units, a plane of memory units, a die of memory units, etc.

In some instances, the rate of initial errors in read operations can be computed using error counts weighted based on an indicator of the severity of the errors. For example, a data item read with one or more initial errors can be weighted according to the number of retries to obtain the error free result. For example, a data item reconstructed from redundant information can be weighted based on the severity of the error (or the number of differences) corrected via the redundant information.

The defect manager (114) monitors the rate of initial errors in read operations. When the rate of initial errors in read operations in a respective region of the non-volatile storage media (109) reaches and/or exceeds a threshold that is identified based on the mode (102) in which the storage system (103) is operating, the defect manager (114) initiates the screening operation for defective memory units in the respective region of the non-volatile storage media (109). Preferably, the threshold is lower in the manufacturing mode than in the user mode.

During the screening operation, the defect manager (114) can test the memory units in the region to identify defective memory units. The defective memory units identified through the screen can be removed from the storage capacity of the non-volatile storage media (109). For example, the flash translation layer can block the use of the defective memory units in storing data, via an address map that defines the logical addresses, used by the host system (101) to identify memory locations, in terms of physical addresses of memory units in the non-volatile storage media (109). For example, the flash translation layer may reserve the physical addresses of the defective memory units such that no logical addresses used by the host system (101) are translated to the physical addresses of the defective memory units.

In some instances, the defect manager (114) identifies, as defective memory units, the memory units that fail to store data. For example, if the data stored in a memory unit is retrieved consistently with errors, which may or may not be recoverable with redundant information but cannot be recovered with retry (e.g., for less than a threshold number of times), the memory unit can be identified as defective. For example, the defect manager (114) may recover the original data stored in the defective memory unit via an excessive number of retries and/or error correction code and store the recovered data in an alternative memory unit. The flash translation layer adjusts the map to translate the logical address, previously translated to the physical address of the defective memory unit, to the physical address of the alternative memory unit that currently stores recovered data. Thus, the screening to determine whether a memory unit is defective can be performed without using writing data in the memory unit being screened.

In some instances, the defect manager (114) identifies, as defective memory units, not only the memory units that fail to store data but also memory units that require excessive retry to retrieve stored data. For example, when a memory unit requires more than a threshold number of read retries to recover data without error, the memory unit can be identified as defective. Thus, after removing the memory units that require more than the threshold number of read retries from the storing capacity of the non-volatile storage media (109), the overall data access performance of the storage system (103) is improved.

In some instances, the error log (125) identifies the memory units that are likely to be defective and/or the memory regions that are likely to have defective memory units. For example, when a data item is retrieved from a memory unit after an number of retries and/or using error correction code, the memory unit can be identified as likely to be defective; and the memory region containing the memory unit can be identified as likely to have defective memory units. Optionally, the defect manager (114) screens the memory units that are likely to be defective and/or the memory regions that are likely to have defective memory units during an idle time, or in response to an elevated rate of read errors.

In some instances, the defect manager (114) priorities the screening of memory units based on the information provided in the error log (125) and/or based on other indicators of the likelihood of defective memory units, such as the numbers of program and erase cycles the memory units have experienced. For example, memory units having been subjected to more program and erase cycles can be screened before screening other memory units.

After the defective memory units are identified and excluded from the use to store data in the storage system (103), read retries and/or error recovery operations in the non-volatile storage media (109) can be reduced; and the likelihood of failing to retrieve stored data is also reduced.

The mode (102) of the storage system (103) can be initially set to indicate a manufacturing mode. Upon completion of diagnosis and testing of the storage system (103) in a manufacturing facility, the host system (101) connected to the storage system (103), or the storage system (103), can change the mode (102) to a value indicating a user mode.

Optionally, the mode (102) is stored in a one time programmable memory. Once the mode (102) is changed to a user mode, the storage system (103) cannot be further revised to run in a manufacturing mode.

Alternatively, the value of the mode (102) can be set during a powering up setup operation (e.g., Basic Input/Output System (BIOS) setup). For example, when the storage system (103) is connected to a host system (101) that is configured in a manufacturing facility, the host system (101) can set the mode (102) to a value indicative of the manufacturing mode. When the host system (101) of a user is not capable of setting the mode (102) to the manufacturing mode during the powering up setup operation, the storage system (103) runs in the user mode.

In general, the host system (101) can use message queues to submit requests/commands that are processed by the task managers running in the processors (121, . . . , 123).

For example, a submission queue (e.g., 111, . . . , or 113) can be used by the host system (101) to submit requests to the storage system (103); and a completion queue (e.g., 115, . . . , or 117) can be used by the host system (101) to receive responses from the storage system (103).

For example, a version of NVMe (e.g., Non-Volatile Memory Host Controller Interface Specification 1.2) specifies the use of a circular buffer with a fixed slot size for a submission queue (e.g., 111, . . . , or 113) or a completion queue (e.g., 115, . . . , or 117).

The NVMe further specifies different types of message queues for the processing of different types of commands. For example, input/output (I/O) commands are limited to be submitted via I/O submission queues; and admin commands are limited to be submitted via admin submission queues. Examples of I/O commands include commands to read data from the storage system (103), commands to write data into the storage system (103), commands to compare data in the storage system (103), etc. Examples of admin commands include commands to manage namespaces, commands to attach namespaces, commands to create I/O submission or completion queues, commands to delete I/O submission or completion queues, commands for firmware management, etc. The NVMe allows multiple I/O submission queues to share an I/O completion queue by explicitly identifying the I/O completion queue in the request for the creation of each of the I/O submission queues.

The NVMe requires that the storage system (103) fetch the commands/requests from a submission queue (111, . . . , or 113) according to the order in which the commands are placed in the submission queue (111, . . . , or 113). However, the NVMe allows the controller (107) to execute the fetched commands in any order.

Figure 3:
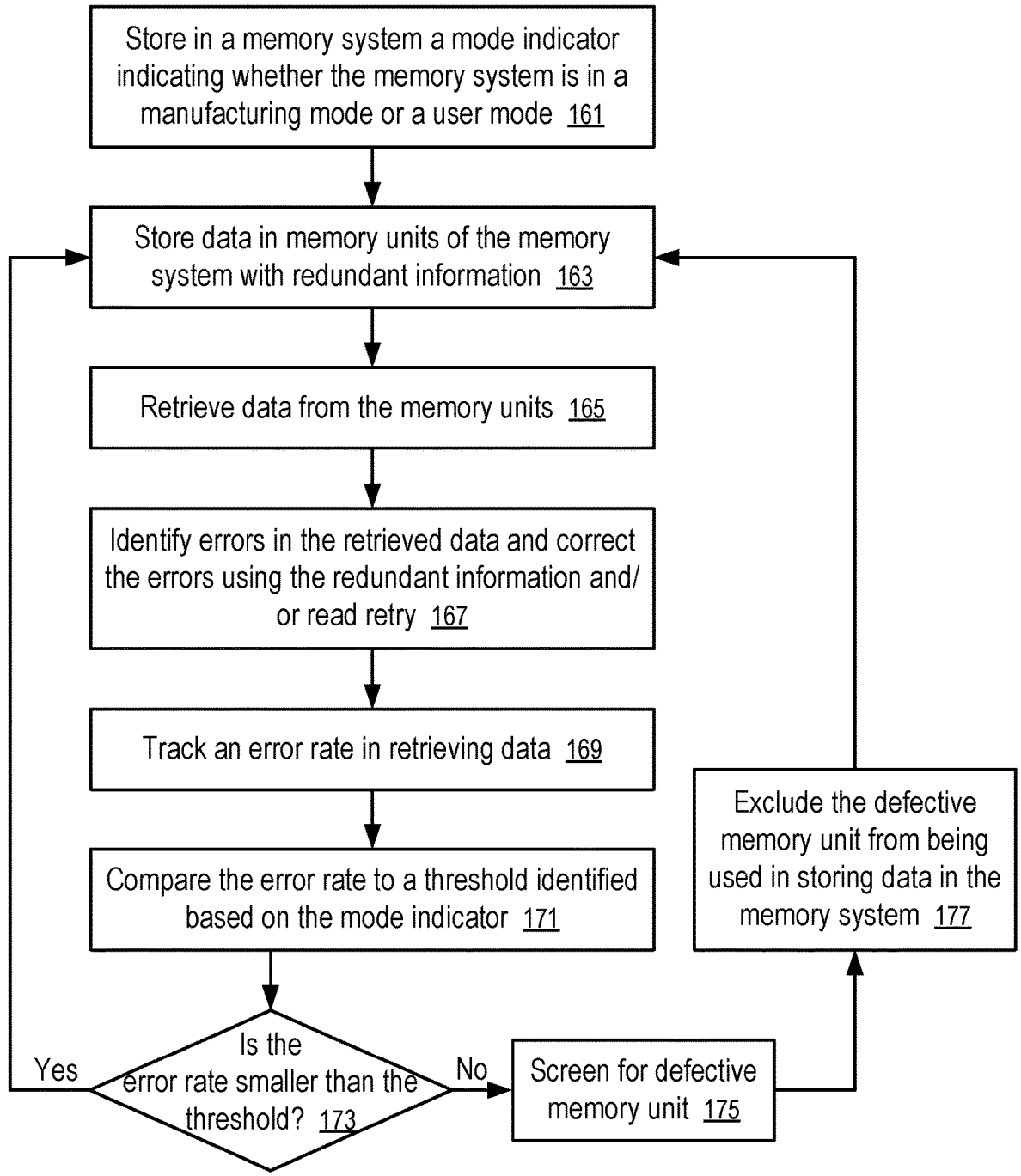
FIG. 3 shows a method to perform defect screening in a memory system.

FIG. 3 shows a method to perform defect screening in a memory system. For example, the method of FIG. 3 can be used in the memory system (108) of FIG. 1 in general and in the storage system (103) of FIG. 2 as an example.

The method of FIG. 3 includes: storing (161) in a memory system (e.g., 108 or 103) a mode indicator (e.g., 102) indicating whether the memory system (e.g., 108 or 103) is being operated in a manufacturing mode or a user mode; storing (163) data in memory units of the memory system (e.g., 108 or 103) with redundant information (e.g., in response to write requests from a host system (101)); retrieving (165) data from the memory units (e.g., in response to read requests from the host system (101)); identifying (167) errors in the retrieved data and correcting the errors using the redundant information and/or via retry read operations; tracking (169) an error rate in retrieving data from the memory units; and comparing (171) the error rate to a threshold that is identified based on the mode indicator (e.g., 102).

If it is determined (173) that the error rate is smaller than the threshold, the memory system (e.g., 108 or 103) continues operations to store (163) data and retrieve (165) data (e.g., in response to further input/output requests from the host system (101), or in idle time garbage collection operations). Otherwise, the method further includes screening (175) for defective memory unit and excluding (177) the defective memory unit from being used in storing data in the memory system (e.g., 108 or 103).

For example, a memory system (e.g., 108 or 103) has non-volatile media (e.g., 109A or 109) having a set of memory units. The memory system (e.g., 108 or 103) has a controller (107) configured to process requests from a host system (101) to store data in the non-volatile media (e.g., 109A or 109) or retrieve data from the non-volatile media (e.g., 109A or 109). The memory system (e.g., 108 or 103) stores an indicator (e.g., 102) indicating whether the memory system (e.g., 108 or 103) is operating in a user mode or a manufacturing mode.

For example, when the memory system (e.g., 108 or 103) is operating in a manufacturing mode, the controller (107) is configured (e.g., via firmware (104)) to perform at least one manufacturing function that is not performed in the user mode, such as a function of testing or diagnosis of the memory system (e.g., 108 or 103) in a manufacturing facility.

For example, after the completion of the manufacturing process of the memory system (e.g., 108 or 103), the indicator (102) can be adjusted or changed to indicate that the memory system (e.g., 108 or 103) is operating in the user mode.

In some implementations, a memory storing the indicator (e.g., 102) is a one-time write memory. Thus, after the indicator (e.g., 102) of the memory system (e.g., 108 or 103) is changed to a user mode, the manufacturing functions of the memory system (e.g., 108 or 103) are disable and cannot be re-enabled without changing the firmware (104) and/or the memory storing the indicator (e.g., 102).

Alternatively, the indicator (102) can be set or changed by the host system (101) during a power-on startup operation. For example, when the memory system (e.g., 108 or 103) is powered up while being connected to a host system (101) in a manufacturing facility, the host system (101) can set the indicator (102) to a manufacturing mode. During a shutdown process, the controller (107) automatically changes the indicator (102) to a user mode, such that when the memory system (e.g., 108 or 103) is used in a host system (101) that is incapable of setting the indicator (102) to a manufacturing mode, the memory system (e.g., 108 or 103) automatically operates in a user mode.

The memory system (e.g., 108 or 103) has a defect manager (114) that can be implemented via the controller (107) running firmware (104) and/or a special purpose logic circuit. The defect manager (114) identifies a threshold based on the indicator (102), and monitors an error rate in reading data from the non-volatile media (109) (e.g., based on an error log (125)).

For example, the error rate identifies the rate of initial errors in successful retrieval of data items where if there is an error, the error is subsequently corrected via retry of read operations and/or via error correction made using redundant information. Thus, the errors as monitored by the error rate do not prevent the successful retrieval of the stored data items.

In response to the error rate reaching the threshold, the defect manager (114) screens at least a portion of the non-volatile media (109) for defective memory units, such as memory units that have errors in retrieved data after retrying reading for more than a threshold number of times and/or memory units that fail to store data correctly.

Preferably, the threshold for triggering the defective memory unit screening is lower when the memory system (e.g., 108 or 103) is operating in the manufacturing mode than when the memory system (e.g., 108 or 103) is operating in the user mode.

For example, the non-volatile media (e.g., 109A or 109) includes a flash memory; and the memory system (e.g., 108 or 103) is a solid-state drive.

For example, the host system (101) and the memory system (e.g., 108 or 103) communicate over a communication channel in accordance with a communication protocol for peripheral component interconnect express bus.

Optionally, the defect manager (114) identifies a priority for screening defective memory units based on an error log (125). For examples, regions and/or memory units having higher rates of errors can be screened prior to screening other memory units.

The storage system (103) of FIG. 2 can be attached to the host system (101) in FIG. 1 as an implementation of the memory system (108). A communication channel between the host system (101) and the memory system (108) in general and the storage system (103) in particular allows the host system (101) to send data requests and/or other commands that trigger certain operations of the controller (107) on the media (e.g., 109A to 109N, 109), such as data write operations, data read operations, data erasure operations. A host interface (105) implements the communication protocols of the communication channel.

In some implementations, the communication channel between the host system (101) and the memory system (108) or the storage system (103) includes a bus for computer peripheral devices, such as a PCIe bus, a SATA bus, a USB bus.

In some implementations, the communication channel between the host system (101) and the storage system (103) includes a computer network, such as a local area network, a wireless local area network, a wireless personal area network, a cellular communications network, a broadband high-speed always-connected wireless communication connection (e.g., a current or future generation of mobile network link); and the host system (101) and the storage system (103) can be configured to communicate with each other using data storage management and usage commands similar to those in NVMe protocol.

The controller (107) of the storage system (103) can run firmware (104) to perform operations responsive to the communications from the host system (101). Firmware in general is a type of computer program that provides control, monitoring and data manipulation of engineered computing devices.

The storage system (103) can have non-volatile storage media (109). Examples of non-volatile storage media (109) include memory cells formed in an integrated circuit and magnetic material coated on rigid disks. Non-volatile storage media (109) can maintain the data/information stored therein without consuming power. Memory cells can be implemented using various memory/storage technologies, such as NAND logic gate, NOR logic gate, phase-change memory (PCM), magnetic memory (MRAM), resistive random-access memory, cross point storage and memory devices (e.g., 3D XPoint memory). A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

In some instances, the controller (107) has in-processor cache memory with data access performance that is better than the volatile DRAM (106) and/or the non-volatile storage media (109). Thus, it is preferred to cache parts of instructions and data used in the current computing task in the in-processor cache memory of the controller (107) during the computing operations of the controller (107). In some instances, the controller (107) has multiple processors (121, . . . , 123), each having its own in-processor cache memory.

Optionally, the controller (107) performs data intensive, in-memory processing using data and/or instructions organized in the storage system (103). For example, in response to a request from a host system (101), the controller (107) performs a real time analysis of a set of data stored in the storage system (103) and communicates a reduced data set to the host system (101) as a response. For example, in some applications, the storage system (103) is connected to real time sensors to store sensor inputs; and the processors (120, 121, . . . , 123) of the controller (107) are configured to perform machine learning and/or pattern recognition based on the sensor inputs to support an artificial intelligence (AI) system that is implemented at least in part via the storage system (103) and/or the host system (101).

In some implementations, the processors (120, 121, . . . , 123) of the controller (107) are integrated with memory (e.g., 119, 109A, . . . , 109N, 106, 109) in computer chip fabrication to enable processing in memory and thus overcome the von Neumann bottleneck that limits computing performance as a result of a limit in throughput caused by latency in data moves between a processor and memory configured separately according to the von Neumann architecture. The integration of processing and memory increases processing speed and memory transfer rate and decreases latency and power usage.

The storage system (103) can be used in various computing systems, such as a cloud computing system, an edge computing system, a fog computing system, and/or a stand-alone computer. In a cloud computing system, remote computer servers are connected in a network to store, manage, and process data. An edge computing system optimizes cloud computing by performing data processing at the edge of the computer network that is close to the data source and thus reduces data communications with a centralize server and/or data storage. A fog computing system uses one or more end-user devices or near-user edge devices to store data and thus reduces or eliminates the need to store the data in a centralized data warehouse.

Some embodiments involving the operation of the controller (107) can be implemented using computer instructions executed by the controller (107), such as the firmware (104) of the controller (107). In some instances, hardware circuits can be used to implement at least some of the functions. The firmware (104) can be initially stored in the non-volatile storage media (109), or another non-volatile device, and loaded into the volatile DRAM (106) and/or the in-processor cache memory for execution by the controller (107).

A non-transitory computer storage medium can be used to store instructions of the firmware (104) of the memory system (108) in general and the storage system (103) in particular. When the instructions are executed by the controller (107) of the memory system (108) or the storage system (103), the instructions cause the controller (107) to perform a method discussed above.

In this description, various functions and operations may be described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor or micro-controller, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processors in a computer, cause the computer to perform operations necessary to execute elements involving the various aspects.

A tangible, non-transitory computer storage medium can be used to store software and data which, when executed by a data processing system, causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in their entirety prior to the execution of the applications. Alternatively, portions of the data and instructions can be obtained dynamically, just in time, when needed for execution. Thus, it is not required that the data and instructions be on a machine-readable medium in their entirety at a particular instance of time.

Examples of computer-readable storage media include, but are not limited to, recordable and non-recordable type media such as volatile and non-volatile memory devices, read only memory (ROM), random access memory (RAM), flash memory devices, floppy and other removable disks, magnetic disk storage media, and optical storage media (e.g., Compact Disk Read-Only Memory (CD ROM), Digital Versatile Disks (DVDs), etc.), among others. The instructions may be embodied in a transitory medium, such as electrical, optical, acoustical or other forms of propagated signals, such as carrier waves, infrared signals, digital signals, etc. A transitory medium is typically used to transmit instructions, but not viewed as capable of storing the instructions.

In various embodiments, hardwired circuitry may be used in combination with software instructions to implement the techniques. Thus, the techniques are neither limited to any specific combination of hardware circuitry and software, nor to any particular source for the instructions executed by the data processing system.

Although some of the drawings illustrate a number of operations in a particular order, operations that are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A memory system, comprising:
   non-volatile media having a set of memory units;
   a controller configured to process requests from a host system to store data in the non-volatile media or retrieve data from the non-volatile media;
   wherein the memory system stores an indicator indicating whether the memory system is operating in a user mode or a manufacturing mode; and
   wherein a defect manager of the memory system identifies a threshold based on the indicator, monitors an error rate in reading data from the non-volatile media and, in response to the error rate reaching the threshold, screens the non-volatile media for defective memory units.

2. The memory system of claim 1, wherein the non-volatile media includes a flash memory.

3. The memory system of claim 2, wherein the memory system is a solid-state drive.

4. The memory system of claim 3, wherein the threshold is lower when the memory system is operating in the manufacturing mode than when the memory system is operating in the user mode.

5. The memory system of claim 4, wherein when the memory system is operating in the manufacturing mode the controller is configured to perform at least one function that is not performed in the user mode.

6. The memory system of claim 5, wherein the function relates to testing or diagnosis in a manufacturing facility.

7. The memory system of claim 5, wherein after completion of manufacturing of the memory system, the indicator is adjusted to indicate that the memory system is operating in the user mode.

8. The memory system of claim 5, wherein during screening of the non-volatile media for defective memory units, the defect manager identifies memory units that have errors in retrieved data after retrying reading for more than a threshold number of times.

9. The memory system of claim 5, wherein during screening of the non-volatile media for defective memory units, the defect manager identifies memory units that fail to store data correctly.

10. The memory system of claim 5, wherein the defect manager identifies a priority for screening defective memory units based on an error log.

11. The memory system of claim 5, wherein the indicator is set by the host system during a power-on startup operation.

12. A method, comprising:
    processing, by a controller of a memory system having non-volatile media, requests from a host system to store data in the non-volatile media or retrieve data from the non-volatile media, the non-volatile media having a set of memory units;
    storing, in the memory system, an indicator indicating whether the memory system is operating in a user mode or a manufacturing mode;
    identifying, by a defect manager of the memory system, a threshold based on the indicator;
    monitoring, by the defect manager, an error rate in reading data from the non-volatile media; and
    in response to the error rate reaching the threshold, screening by the defect manager the non-volatile media for defective memory units.

13. The method of claim 12, wherein the non-volatile media includes a flash memory; the memory system is a solid-state drive; and the host system and the memory system communicate over a communication channel in accordance with a communication protocol for peripheral component interconnect express bus.

14. The method of claim 13, wherein:
    in response to the memory system operating in the manufacturing mode, a manufacturing mode threshold is identified; and
    the screening of the non-volatile media for defective memory units is in response to the error rate reaching the manufacturing mode threshold;
    in response to the memory system operating in the user mode, a user mode threshold is identified; and
    the screening of the non-volatile media for defective memory units is in response to the error rate reaching the user mode threshold; and
    the manufacturing mode threshold is lower than the user mode threshold.

15. The method of claim 14, further comprising:
in response to the memory system operating in the manufacturing mode, performing by the controller at least one testing or diagnosis function that is not performed in the user mode.

16. The method of claim 15, wherein the screening of the non-volatile media for defective memory units includes identifying memory units that have errors in retrieved data after retrying reading for more than a threshold number of times.

17. The method of claim 16, wherein the screening of the non-volatile media for defective memory units includes identifying memory units that fail to store data.

18. The method of claim 17, further comprising:
identifying a priority for screening defective memory units based on a log of errors recorded in reading data from memory units where errors are removed via at least one of:
  retry of read operations; and
  error correction made using redundant information.

19. A non-transitory computer storage medium storing instructions which, when executed by a memory system having non-volatile media, and a controller, cause the memory system to perform a method, the method comprising:
processing, by the controller, requests from a host system to store data in the non-volatile media or retrieve data from the non-volatile media, the non-volatile media having a set of memory units;
identifying a threshold based on whether the memory system is operating in a user mode or a manufacturing mode;
monitoring an error rate in reading data from the non-volatile media; and
in response to the error rate reaching the threshold, screening the non-volatile media for defective memory units.

20. The non-transitory computer storage medium of claim 19, wherein:
when the memory system is operating in the manufacturing mode, a manufacturing mode threshold is identified; and
the screening of the non-volatile media for defective memory units is in response to the error rate reaching the manufacturing mode threshold;
when the memory system is operating in the user mode, a user mode threshold is identified; and
the screening of the non-volatile media for defective memory units is in response to the error rate reaching the user mode threshold; and
the manufacturing mode threshold is lower than the user mode threshold.

* * * * *